(12) United States Patent
Shobara et al.

(10) Patent No.: US 6,203,378 B1
(45) Date of Patent: Mar. 20, 2001

(54) CARD CONNECTING ADAPTER

(75) Inventors: Yoshitaka Shobara; Kiyoshi Washino, both of Kanagawa (JP)

(73) Assignee: Japan Solderless Terminal MGF. Co., Ltd, Osaka (JP)

( * ) Notice: Subject to any disclaimer, the term of this patent is extended or adjusted under 35 U.S.C. 154(b) by 0 days.

(21) Appl. No.: 09/255,878

(22) Filed: Feb. 23, 1999

(30) Foreign Application Priority Data

Feb. 26, 1998 (JP) .................................... 10-045960

(51) Int. Cl.[7] ..................... H01R 25/00; H01R 27/02; H01R 31/00; H01R 33/88; H01R 33/90

(52) U.S. Cl. ..................... 439/638; 439/141; 439/155

(58) Field of Search .................................... 439/140, 141, 439/155, 638; 361/684, 686, 372

(56) References Cited

U.S. PATENT DOCUMENTS

| 5,035,633 | * | 7/1991 | Kobayashi et al. | 439/140 |
| 5,457,601 | * | 10/1995 | Georgopulos et al. | 361/686 |
| 5,889,649 | * | 3/1999 | Nabetani et al. | 361/684 |

FOREIGN PATENT DOCUMENTS

| 6-223241 | 8/1994 | (JP) . |
| 6-318390 | 11/1994 | (JP) . |
| 7-296920 | 11/1995 | (JP) . |
| 8-55661 | 2/1996 | (JP) . |
| 9-171863 | 6/1997 | (JP) . |

\* cited by examiner

Primary Examiner—Lincoln Donovan
Assistant Examiner—Brian S. Webb
(74) Attorney, Agent, or Firm—Rader, Fishman & Grauer

(57) ABSTRACT

A card connecting adapter for connecting, to a card slot of one standard, a card of the other standard. The adapter has a first connecting portion corresponding to the card slot, a second connecting portion corresponding to the card, a plurality of terminals for electrical connection to the card, shutter mechanism, and locking mechanism. The shutter mechanism has a shutter member displaceable between a protecting position where the terminals are protected from the exterior and a connecting position where the terminals are exposed, and interlocking mechanism for displacing the shutter member in synchronization with operations for mounting/removing the card on/from the second connecting portion. The locking mechanism includes a locking spring member that is disengaged from the shutter member upon being deformed by the mounting of the card, and that is returned to an engaged state with the shutter member by removal of the card. The locking mechanism thus allows the displacement of the shutter member when mounting the card, while inhibiting the displacement of the shutter member when removing the card.

19 Claims, 14 Drawing Sheets

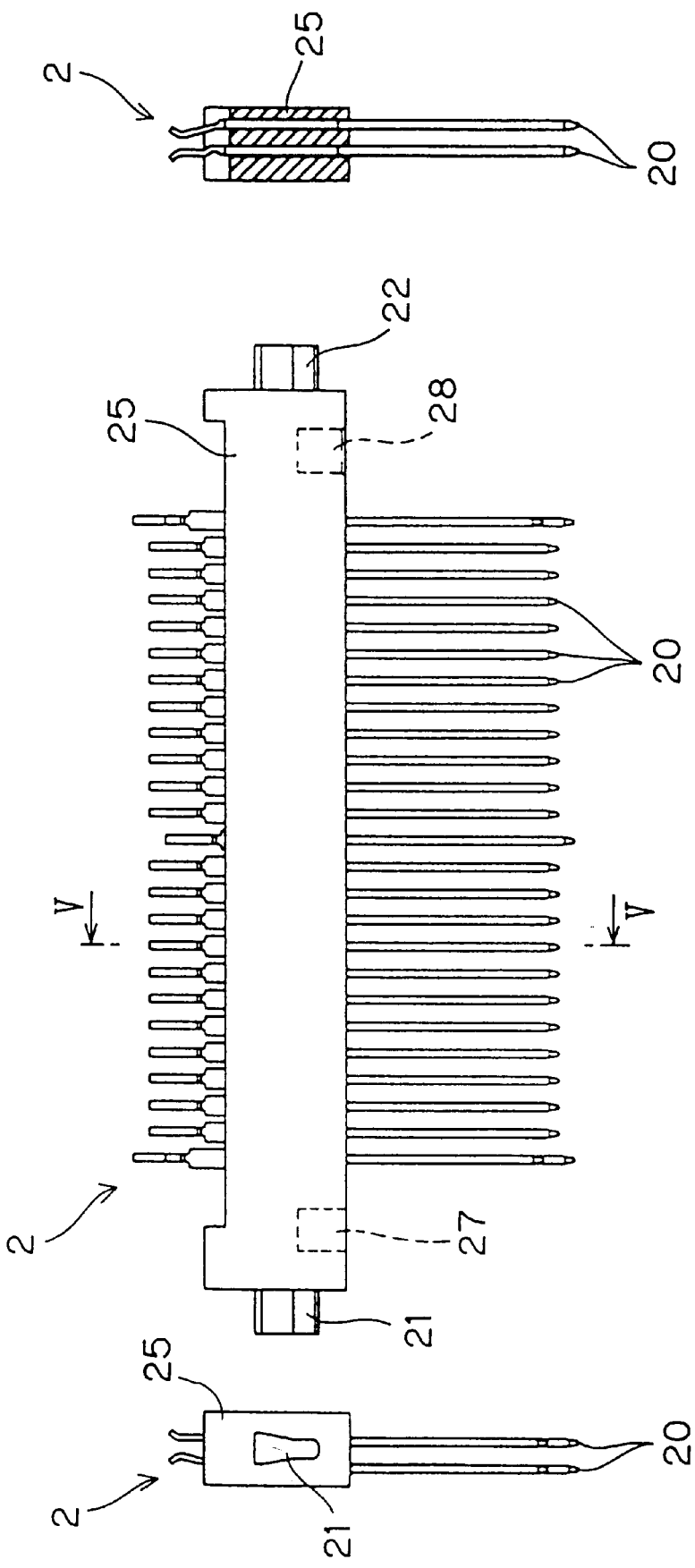

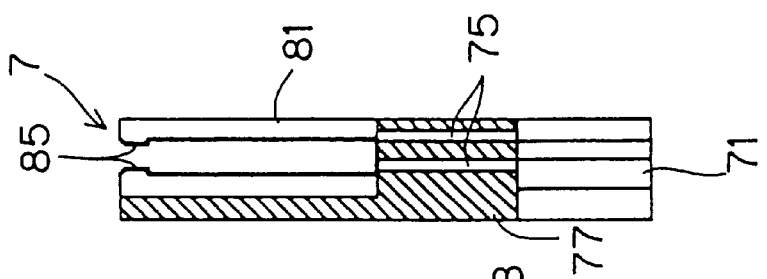
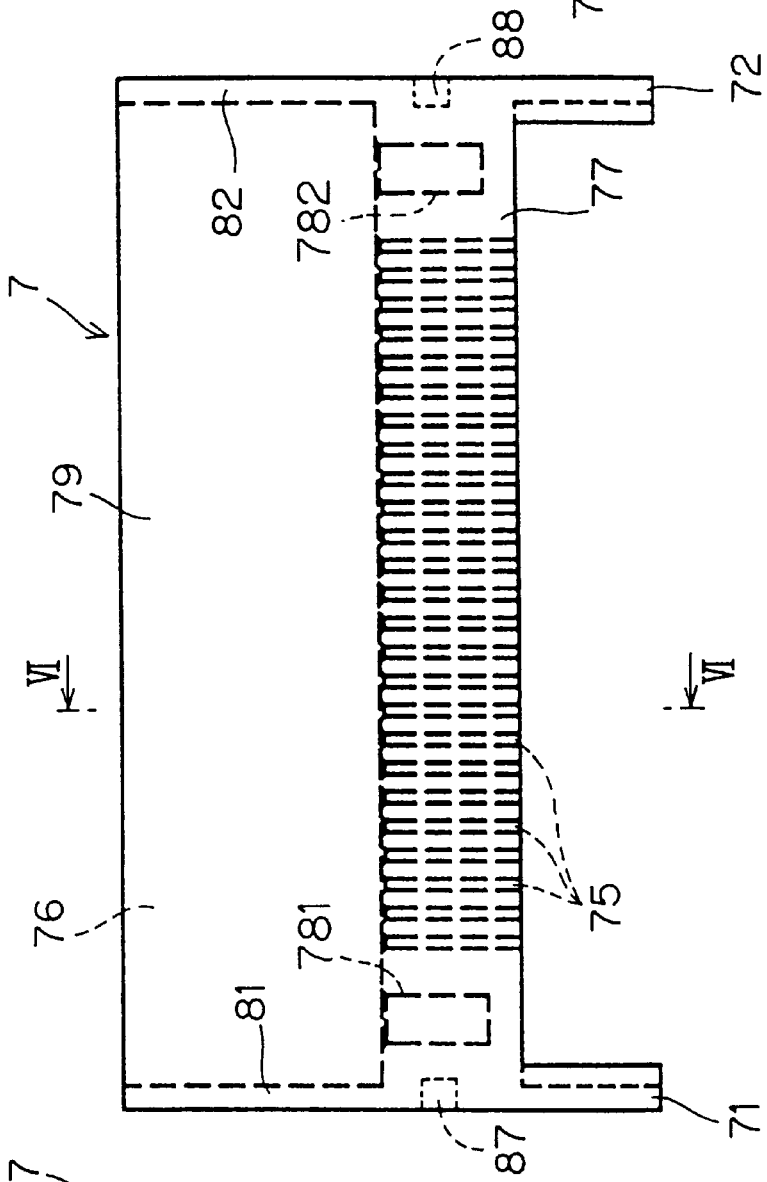
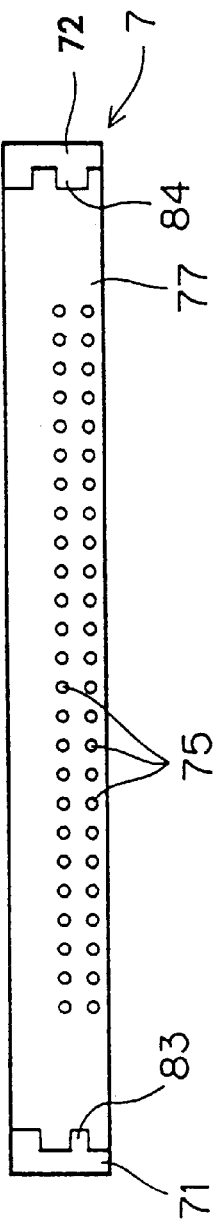
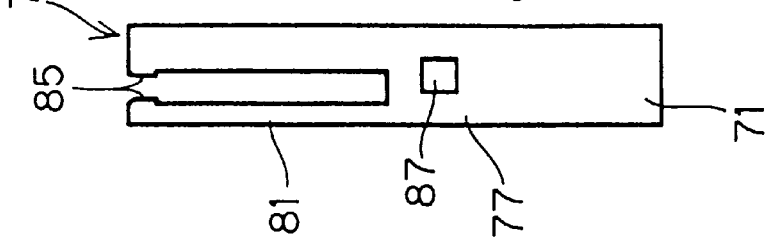

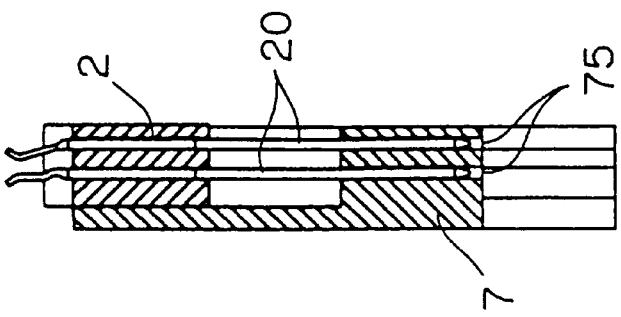
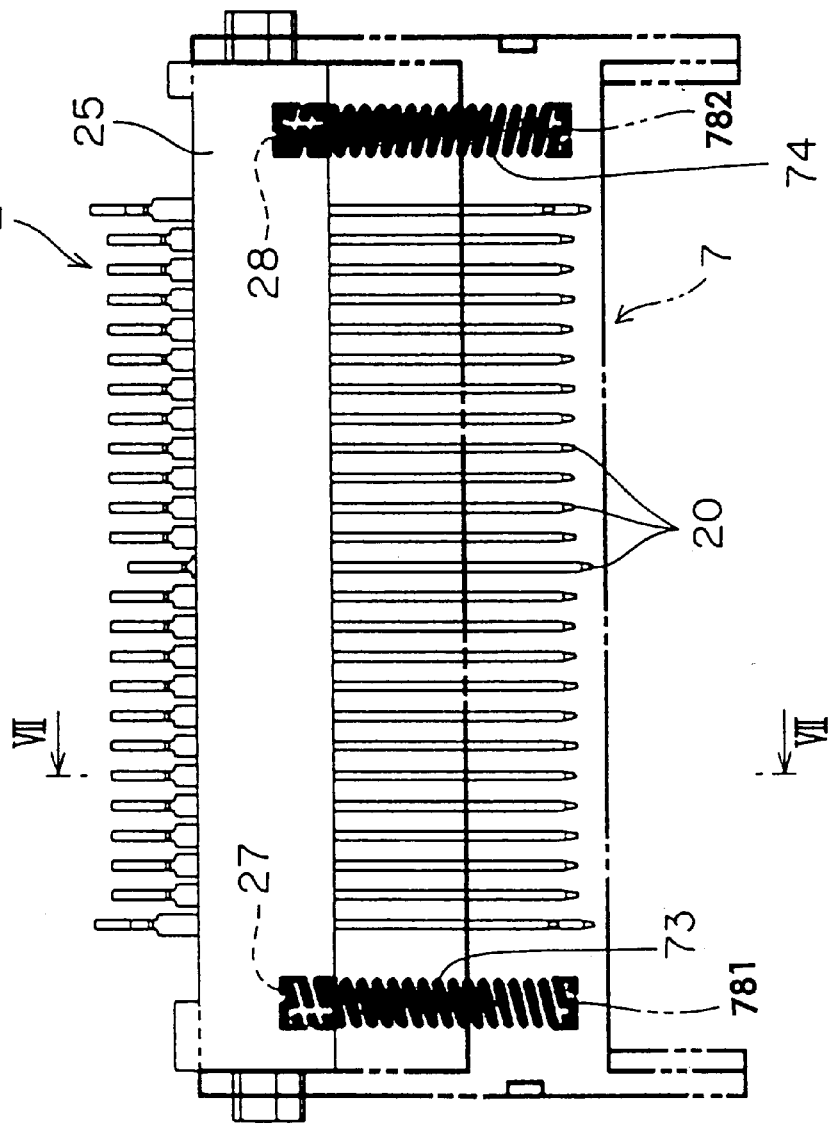
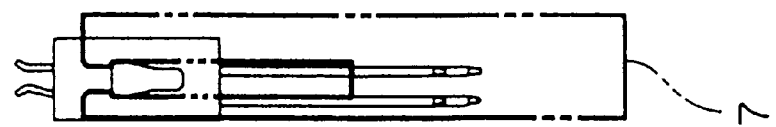

F I G. 13
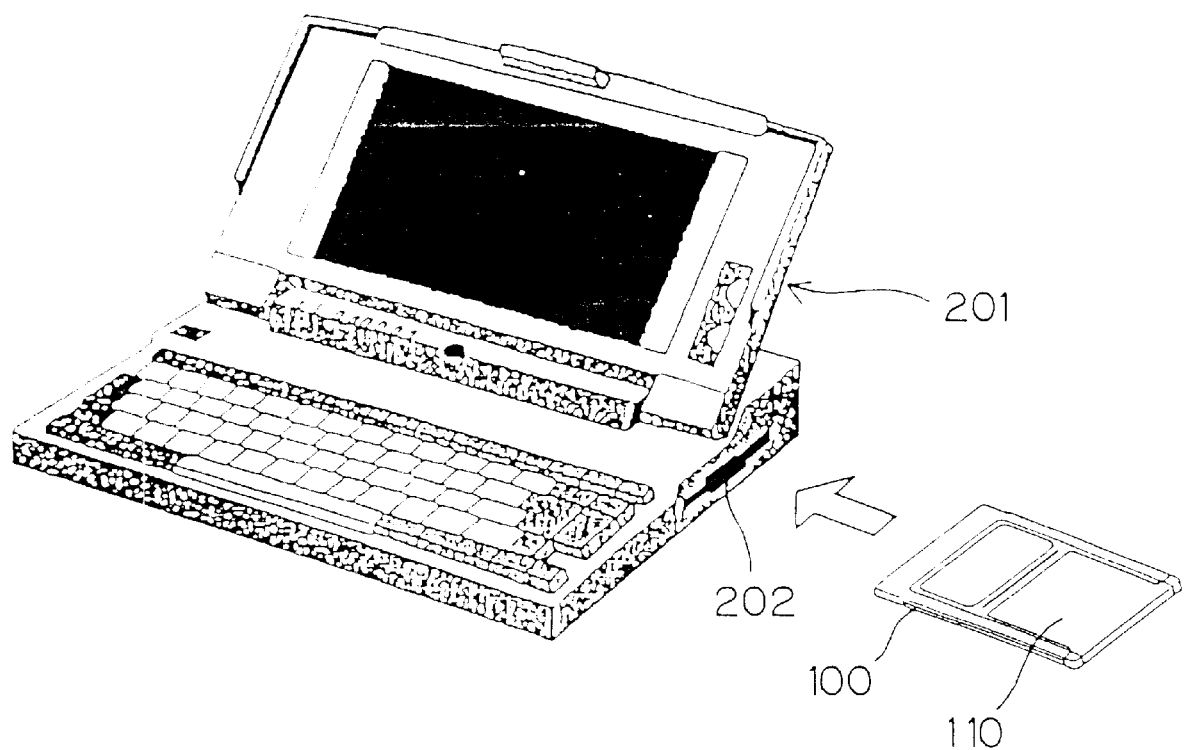

CARD CONNECTING ADAPTER

BACKGROUND OF THE INVENTION

1. Field of the Invention

The present invention relates to a card connecting adapter for relaying and connecting an information equipment such as a personal computer and a card for expanding the feature of the information equipment.

2. Description of Related Art

In recent years, a PC card slot has been generally provided in a notebook-sized personal computer. The feature of the notebook-sized personal computer can be expanded by mounting a PC card on the PC card slot. Examples of the PC card include a flash memory card, a modem card, and an SCSI (Small Computer System Interface) card.

The PC card adheres to a standard set by PCMCIA (Personal Computer Memory Card International Association), and its external form is a rectangle having a width of 54.0 mm and having a length of 85.6 mm as viewed from the top. There are two types of PC cards; one having a thickness of 3.3 mm (type I) and the other having a thickness of 5.0 mm (type II).

On the other hand, in a small-sized information equipment which is represented by a portable information equipment, a digital camera, and an electronic notebook, a PC card cannot be used as it is due to a strict request for miniaturization. Therefore, a smaller-sized CF (CompactFlash (trademark)) card may, in some cases, be used. A representative of the CF card is a flash memory card. The CF card containing a flash memory is used for storing data representing an image picked up by the digital camera or data representing a schedule or an address in the electronic notebook.

The CF card adheres to a standard set by CFA (CompactFlash Association). Conventionally, a CF card in an external shape of a rectangle having a width of 36.4 mm and having a length of 42.5 mm as viewed from the top and having a thickness of 3.3 mm has been generally used.

A small-sized information equipment does not necessarily have sufficient data processing capabilities. Therefore, for example, a digital camera is often under the necessity of accepting and editing data representing collected images in the notebook-sized personal computer, and an electronic notebook is often under the necessity of exchanging data representing a schedule or an address between the electronic notebook and a notebook-sized personal computer.

If an attempt to mount a CF card on a notebook-sized personal computer is made in order to accept data in a small-sized information equipment in the notebook-sized personal computer, the CF card cannot be mounted as it is because the PC card slot is constructed in accordance with the standard set by PCMCIA.

A card connecting adapter for connecting a CF card to a PC card slot has been conventionally provided.

The card connecting adapter has at its front end a first connecting portion connected to the PC card slot, and has at its rear end a second connecting portion connected to the CF card. The construction thereof in the vicinity of the second connecting portion is illustrated in FIG. 14.

Metal cover plates 302 and 303 for discharging a static charge from the human body are respectively provided on an upper surface and a lower surface of a card connecting adapter 301, similarly to a PC card. A plurality of terminals 306 are provided in parallel in a second connecting portion 305. The metal cover plates 302 and 303 respectively extend to positions where they can cover, from above and beneath, the plurality of terminals 306. By this construction, the terminals 306 are protected from deformation due to an external force.

The card connecting adapter 301 is constructed in imitation of a PC card of the type II, for example, and the distance between the surfaces of the metal cover plates 302 and 303 (that is, the thickness of the adapter 301) is set to 5.0 mm. In this case, a CF card 307 having a thickness of 3.3 mm enters a portion between the metal cover plates 302 and 303, so that it can be connected to the terminals 306.

A CF card 307 and the card connecting adapter 301 are thus integrated to form a PC card of the type II as a whole, which can be mounted on a PC card slot.

In a CF card containing a flash memory, a request to increase its storage capacity is strong. In order to meet the request, a CF card 310 adhering to a new standard which has the same plane shape as that in the conventional example and has a thickness of 5.0 mm has been proposed, as shown in FIG. 15. The CF card adhering to the proposed standard shall be referred to as "a CF card of a type II".

The CF card 310 of the type II has a thickness of 5.0 mm, which is the same as that of the card connecting adapter 301. Since the CF card 310 of the type II cannot enter the portion between the metal cover plates 302 and 303, it cannot be mounted on the card connecting adapter 301.

The increase in the thickness of the card connecting adapter 301 is not allowed because it does not meet the type II standard of the PC card. Therefore, it is considered that the CF card 310 of the type II is allowed to be mounted by eliminating projected parts 302a and 303a of the metal cover plates 302 and 303 to make the terminals 306 bare.

If the terminals 306 are bare, however, the terminals 306 may be deformed upon receipt of an external force under the circumstances where a CF card is not mounted.

SUMMARY OF THE INVENTION

An object of the present invention is to provide a card connecting adapter so constructed that terminals can be effectively prevented from being deformed even when the thickness of the card connecting adapter and the thickness of a card mounted thereon are equal to each other.

A card connecting adapter according to the present invention is used for connecting, to a card slot adhering to a predetermined first standard (for example, a type II set by PCMCIA), a card adhering to a second standard different from the first standard (for example, a CF card of a type II). The adapter comprises a first connecting portion adhering to the first standard, a second connecting portion adhering to the second standard, a plurality of terminals provided in the second connecting portion for electrical connection to the card adhering to the second standard, shutter mechanism having a shutter member provided so as to be displaceable between a protecting position where the plurality of terminals are protected from the exterior and a connecting position where the plurality of terminals are exposed, and interlocking mechanism for displacing the shutter member from the protecting position to the connecting position in synchronization with an operation for mounting the card on the second connecting portion, while displacing the shutter member from the connecting position to the protecting position in synchronization with an operation for removing the card from the second connecting portion, and locking mechanism which enters an unlocked state where the displacement of the shutter member is allowed in synchronization with the operation for mounting the card on the second connecting portion, while entering a locked state where the displacement of the shutter member is inhibited in synchronization with the operation for removing the card from the second connecting portion.

According to the above-mentioned construction, the shutter member is displaced from the protecting position to the connecting position in synchronization with the operation for mounting the card, so that the terminals in the second connecting portion are exposed. Therefore, the card can be connected to the second connecting portion irrespective of the thickness of the card. Even when the thickness of the card connecting adapter and the thickness of the card mounted thereon are equal to each other, therefore, the connection therebetween is not interfered with.

On the other hand, the shutter member is displaced from the connecting portion to the protecting position in synchronization with the operation for removing the card. In a state where the card is removed, therefore, the terminals in the second connecting portion are protected from deformation due to an external force.

Further, in the present invention, the locking mechanism for locking the shutter member at the protecting position are provided in order to reliably protect the terminals in the second connecting portion. The locking mechanism enters the unlocked state in synchronization with the operation for mounting the card, while entering the locked state in synchronization with the operation for removing the card. Consequently, the mounting of the card is not interfered with, and the displacement of the shutter member is reliably regulated in a state where the card has been removed. When the card is removed, therefore, the terminals in the second connecting portion may not be carelessly exposed.

It is preferable that the locking mechanism enters the unlocked state earlier than the time when the sliding of the shutter member is started by the interlocking mechanism.

The interlocking mechanism may comprise a guiding member for guiding the card in the direction in which the shutter member is mounted/removed.

More specifically, the interlocking mechanism may comprise a spring member for elastically urging the shutter member toward the protecting position.

According to the construction, the return of the shutter member to the protecting position at the time of the operation for removing the card can be achieved in simple construction by using the spring member.

It is preferable that the interlocking mechanism is so constructed that the shutter member is displaced with an end surface of the card and an end of the shutter member being kept abutted against each other. Consequently, the terminals in the second connecting portion are always protected by either the shutter member or the card, so that they can be more reliably prevented from being deformed due to the external force.

Furthermore, the locking mechanism may comprise a locking spring member which is disengaged from the shutter member upon being deformed by the mounting of the card, while being returned to an engaged state with the shutter member by the removal of the card. In this case, if the locking spring member is deformed by a predetermined part of the mounted card, for example, the locking mechanism can be realized in simple construction.

More specifically, it is preferable that the locking spring member have an abutting portion which is abutted against the card that is being mounted and an engaging portion which is engaged with a predetermined part of the shutter member, and is elastically deformed upon abutment of the card that is being mounted against the abutting portion, the engaging portion and the shutter member being disengaged from each other by the elastic deformation.

It is preferable that the locking spring members are provided in relation to both sides with respect to the direction of mounting of the card. In this construction, even if one of the locking spring members and the shutter member is disengaged from each other by the fingers of a user, for example, the engaged state of the other locking spring member is not released, so that the shutter member is not carelessly displaced. That is, both the locking spring members are not disengaged from the shutter member so long as the card is not inserted, thereby making it possible to effectively protect the terminals in the second connecting portion.

It is preferable that the shutter member has terminal insertion holes each of which can contain a predetermined number of terminals out of the plurality of terminals in the second connecting portion, so that the plurality of terminals can be contained in the plurality of terminal insertion holes at the protecting position, while being exposed from the plurality of terminal insertion holes at the connecting position.

According to this construction, the terminals can be protected by containing a predetermined number (which may be one or two or more) of terminals in each of the terminal insertion holes, thereby making it possible to effectively prevent the terminals from being deformed.

It is preferable that each of the terminal insertion holes corresponds to one of the terminals in the second connecting portion.

According to this construction, the terminals are respectively contained in the terminal insertion holes, thereby making it possible to more reliably prevent the terminals from being deformed.

The shutter member may have a pair of flat plates arranged opposite to each other with the plurality of terminals in the second connecting portion interposed therebetween, so that the plurality of terminals can be contained in a containing space between the pair of flat plates at the protecting position, while being exposed from the containing space between the pair of flat plates at the connecting position.

According to this construction, the terminals can be protected by the pair of flat plates, thereby making it possible to simplify the construction of the shutter member.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5A is a side view of a second connecting portion, FIG. 5B is a plan view thereof, and FIG. 5C is a cross-sectional view taken along a line V—V shown in FIG. 5B;

FIG. 6A is a side view of a shutter member, FIG. 6B is a plan view thereof, FIG. 6C is a cross-sectional view taken along a line VI—VI shown in FIG. 6B, and FIG. 6D is a front view thereof;

FIG. 7A is a side view of an assembly of the second connecting portion and the shutter member, FIG. 7B is a plan view thereof, and FIG. 7C is a cross-sectional view taken along a line VII—VII shown in FIG. 7B;

FIG. 13 is a perspective view for explaining a manner where the card connecting adapter is used;

DESCRIPTION OF THE PREFERRED EMBODIMENTS

Figure 1:
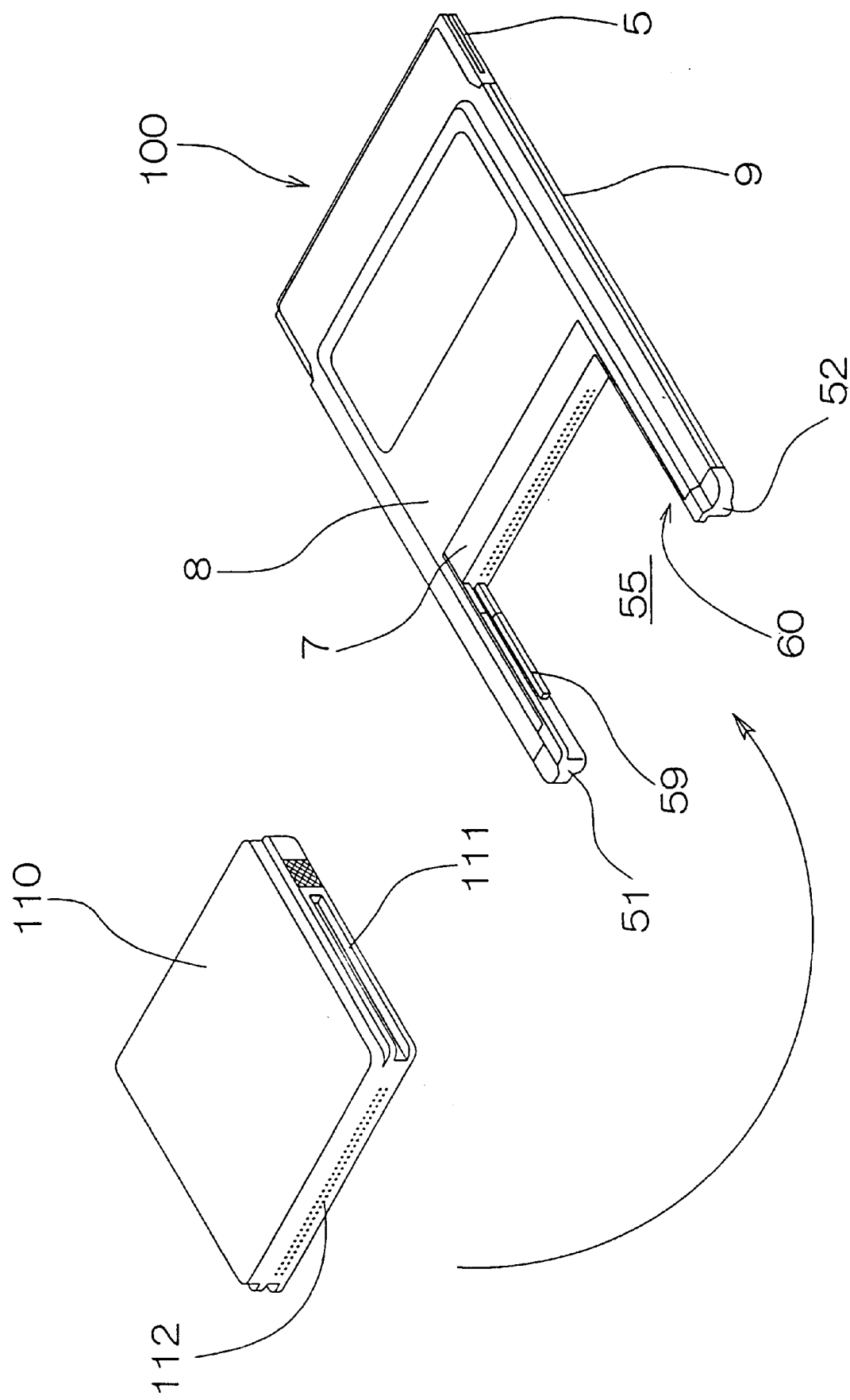
FIG. 1 is a perspective view showing the construction of a card connecting adapter according to a first embodiment of the present invention.

FIG. 1 is a perspective view showing the construction of a card connecting adapter 110 according to one embodiment of the present invention. The card connecting adapter 100 is, as shown in FIG. 13, adapted to a PC card slot 202 adhering to a standard of the type II set by PCMCIA which is provided in an information equipment 201 such as a notebook-sized personal computer, and can take the form of a PC card adhering to the standard of the type II set by PCMCIA in a state where a CF card 110 of the type II is mounted.

Figure 2A:
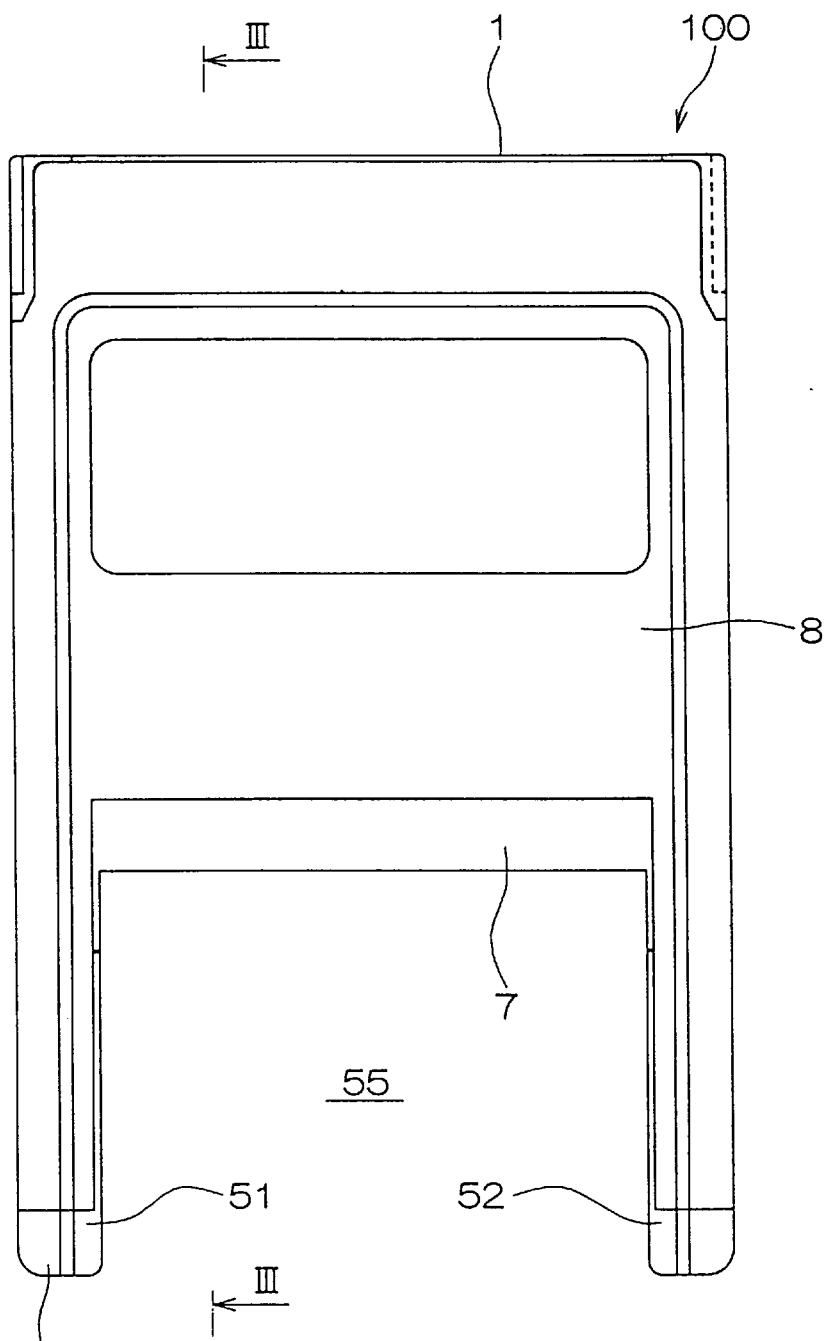
FIG. 2A is a plan view of the card connecting adapter.
Figure 2B:
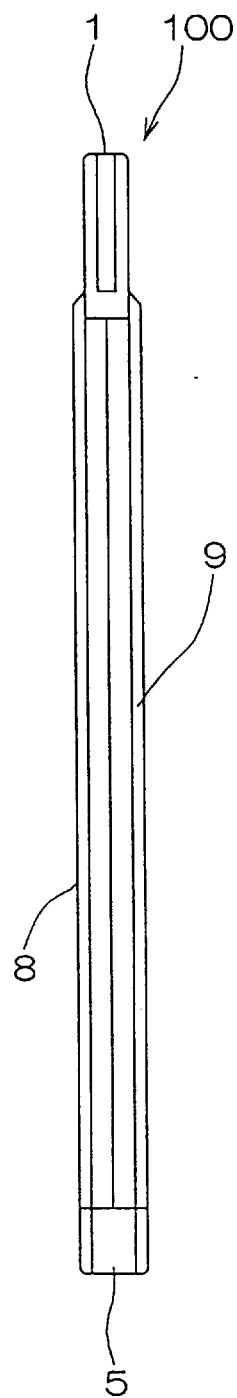
FIG. 2B is a side view thereof.
Figure 2C:
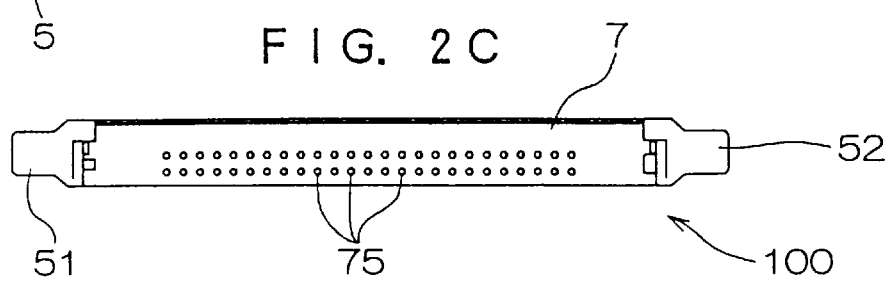
FIG. 2C is a front view thereof.
Figure 3:
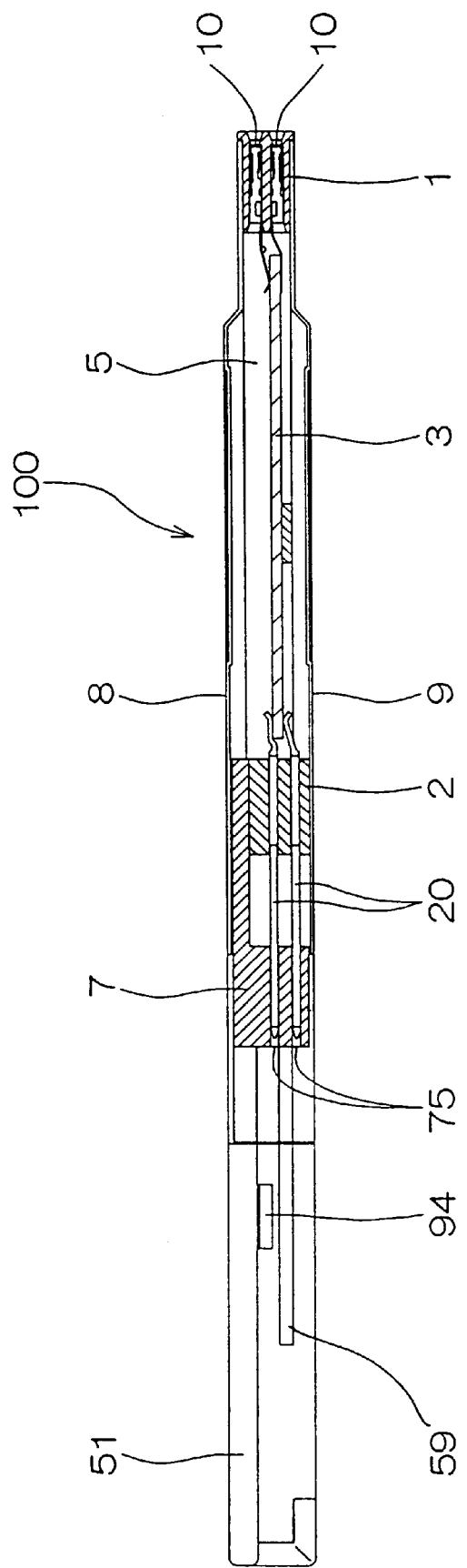
FIG. 3 is a cross-sectional view taken along a line III—III shown in FIG. 2A.

FIG. 2A is a plan view of the card connecting adapter 100, FIG. 2B is a side view thereof, and FIG. 2C is a front view thereof. FIG. 3 is a cross-sectional view taken along a line III—III shown in FIG. 2A.

The card connecting adapter 100 has a first connecting portion 1 which is to be mounted on a connector (not shown) provided in a depth of the PC card slot 202 (see FIG. 13), a second connecting portion 2 on which the CF card 110 is mounted, and a printed circuit board 3 in which a wiring pattern for connecting the first connecting portion 1 and the second connecting portion 2 is formed. Wiring formed on the printed circuit board 3 connects a plurality of terminals 10 provided side by side in the first connecting portion 1 with a plurality of terminals 20 provided side by side in the second connecting portion 2 in a predetermined manner. The terminal 10 is a female terminal which can be engaged with a male terminal on the PC card slot 202. The terminal 20 is a male terminal which can be engaged with a female terminal on the CF card 110.

More specifically, the card connecting adapter 100 has a frame 5 composed of a resin molded product, the first connecting portion 1 is fixed to one end of the frame 5, and the second connecting portion 2 is fixed to the vicinity of the center of the frame 5. The printed circuit board 3 is fixed between the connecting portions 1 and 2. Metal cover plates 8 and 9 are respectively disposed on an upper surface and a lower surface of the frame 5. The metal cover plates 8 and 9 are electrically connected to a ground conductor pattern on the printed circuit board 3 so that a static charge produced from the body of a user can be discharged.

The frame 5 has a pair of arms 51 and 52 extending parallel to each other toward the direction away from the first connecting portion 1 from both sides of the second connecting portion 2, and a mounting space 55 for receiving the CF card 110 is formed between the arms 51 and 52. Notches for opening the mounting space 55 are respectively formed in the metal cover plates 8 and 9. The size of the notch is approximately equal to that of the external form of the CF card 110 as viewed from the top.

A shutter member 7 is arranged in the vicinity of root portions of the arms 51 and 52. The shutter member 7 is slidably displaceable with respect to the second connecting portion 2 in a direction parallel to the terminals 20. The shutter member 7 is for protecting the terminals 20 in the second connecting portion 2 from deformation due to an external force, and is mounted on the frame 5 so as to be slidable between a protecting position (a position shown in FIG. 3) where the terminals 20 are covered and a connecting position where the terminals 20 are exposed to allow the connection to the CF card 110.

Figure 4A:
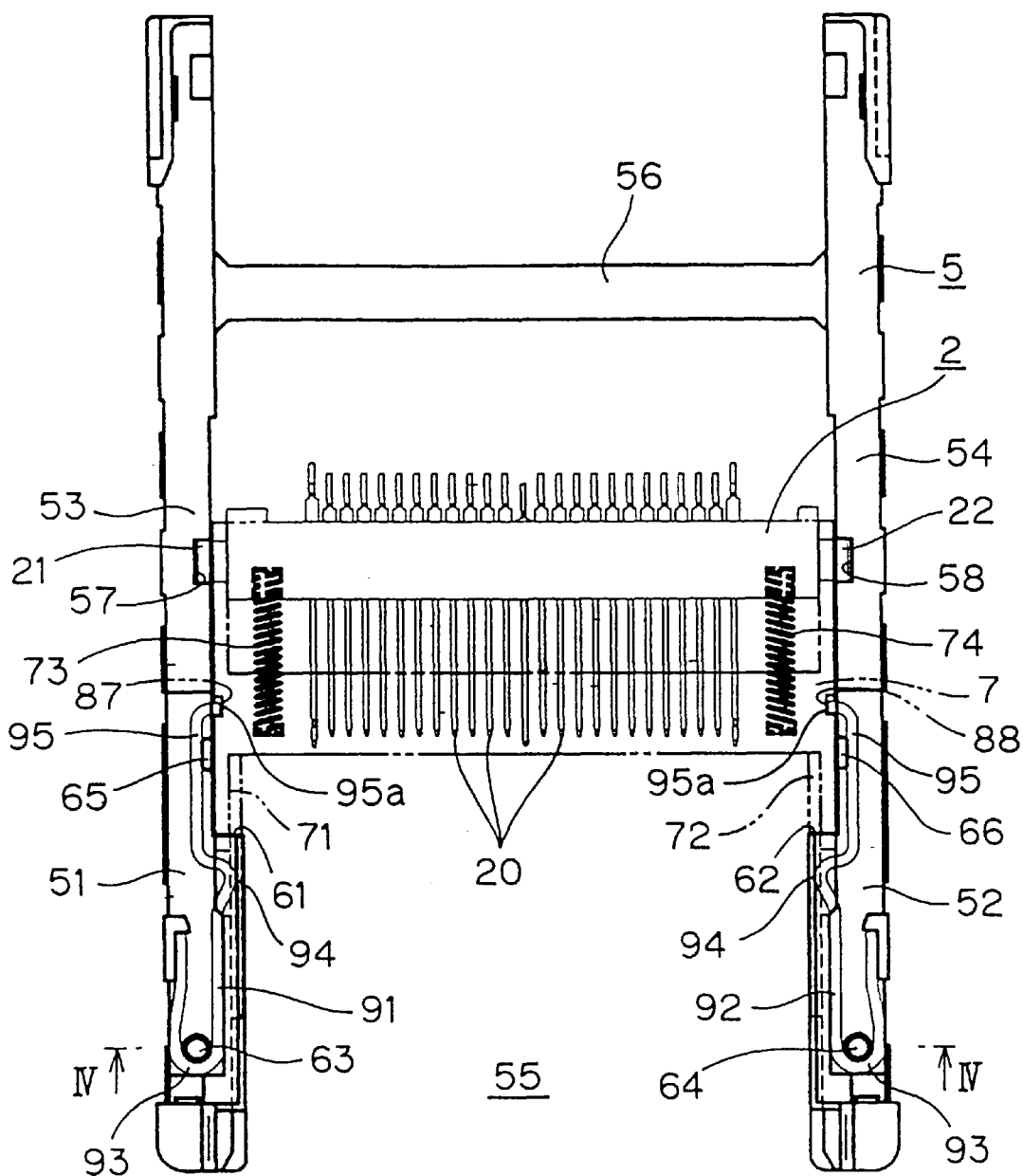
FIG. 4A is a plan view showing the construction of a frame.
Figure 4B:
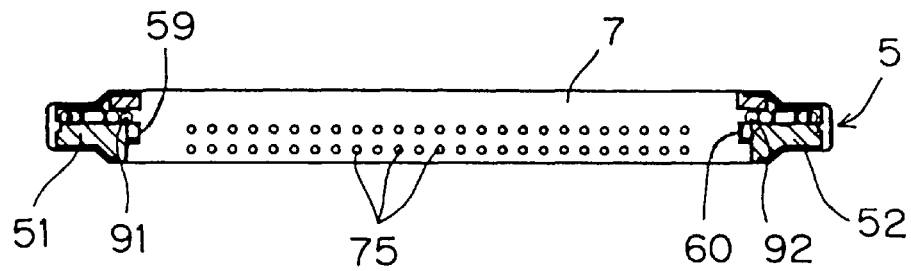
FIG. 4B is a cross-sectional view taken along a line IV—IV shown in FIG. 4A.

FIG. 4A is a plan view showing the construction of the frame 5, and FIG. 4B is a cross-sectional view taken along a line IV—IV shown in FIG. 4A. FIGS. 4A and 4B illustrate a structure excluding the metal cover plates 8 and 9 and the first connecting portion 1. The shutter member 7 is indicated by a two-dot and dash line. The frame 5 has a pair of side bars 53 and 54 parallel to each other, and a connecting bar 56 for connecting the side bars 53 and 54 at their positions near the first connecting portion 1. Mounting recesses 57 and 58 are formed on opposite surfaces in the vicinities of the centers of the side bars 53 and 54, and mounting projections 21 and 22 at both ends of the second connecting portion 2 are respectively engaged with the recesses 57 and 58.

Portions on the side of the mounting space 55 of the side bars 53 and 54 respectively constitute the above-mentioned arms 51 and 52. The arms 51 and 52 respectively have rails 59 and 60 formed on their inner side surfaces serving as guiding members, extending to the vicinities of their intermediate portions from the root portions, for guiding the CF card 110. The rails 59 and 60 are composed of keys which are slidably engageable with key grooves 111 (see FIG. 1) formed on both sides of the CF card 110 for assisting a mounting operation of the CF card 110 as well as preventing the CF card 110 from being mounted on the card connecting adapter 100 with the card turned over.

Steps 61 and 62 are respectively provided at positions, near the second connecting portion 2, of the arms 51 and 52. The steps 61 and 62 can receive a pair of arms 71 and 72 projected forward from both sides of the shutter member 7. The shutter member 7 is urged forward by a pair of helical compression springs 73 and 74 interposed between the second connecting portion 2 and the shutter member 7. The forward movement of the shutter member 7 by an urging force of the helical springs 73 and 74 is regulated by the steps 61 and 62.

Locking springs 91 and 92 constituting locking mechanisms are respectively mounted on the arms 51 and 52 of the frame 5. Each of the locking spring 91 and 92 is constructed by deforming low carbon steel wires, and has a mounting portion 93 which is curved by about 180 degrees, an abutting portion 94 which is deformed in an angular shape so as to be projected toward the mounting space 55 in the middle portion on one side of the mounting portion 93, and an engaging portion 95 extending toward the shutter member 7 from the abutting portion 94 and having a front end 95a which is curved toward a side surface of the shutter member 7. The mounting portions 93 of the springs 91 and 92 are respectively fitted in bosses 63 and 64 provided in the vicinities of front ends of the arms 51 and 52, and the engaging portions 95 are respectively engaged with engaging projections 65 and 66 provided in the vicinities of the root portions of the arms 51 and 52. The locking springs 91 and 92 produce forces to direct the engaging portions 95 toward the sides of the shutter member 7.

The respective abutting portions 94 in the locking springs 91 and 92 are projected from the surfaces of the rails 59 and 60. In the process of inserting the CF card 110 along the rails 59 and 60, therefore, the abutting portions 94 and a side surface of the CF card 110 are abutted against each other, and when the CF card 110 is further inserted, the engaging portions 94 are pressed into the arms 51 and 52 against spring forces of the locking springs 91 and 92. Correspondingly, the engaging portions 95 are displaced away from the sides of the shutter member 7.

FIGS. 5A to 5C are diagrams for explaining the construction of the second connecting portion 2, where FIG. 5A is a side view, FIG. 5B is a plan view, and FIG. 5C is a cross-sectional view taken along a line V—V shown in FIG. 5B. The second connecting portion 2 has a plurality of male terminals 20 which are respectively engaged with a plurality of terminals arranged in a connecting portion 112 (see FIG. 1) at a front end of the CF card 110, and a main body 25 composed of a resin molded product for holding the plurality of male terminals 20 in parallel. The terminal 20 passes through the main body 25, its one end constituting a contact portion which is engaged with the terminal provided in the connecting portion 112 of the CF card 110, and the other end constituting a mounting portion which is connected to the printed circuit board 3 by soldering.

The main body 25 is formed so as to extend in a direction perpendicular to the terminals 20, and has mounting projections 21 and 22, integrally formed at both its ends, which are respectively engaged with the recesses 57 and 58 of the frame 5. Spring mounting recesses 27 and 28 for receiving the helical springs 73 and 74 are respectively formed, facing the shutter member 7, in the vicinities of both the ends of the main body 25.

FIGS. 6A to 6D are diagrams for explaining the construction of the shutter member 7, where FIG. 6A is a side view, FIG. 6B is a plan view, FIG. 6C is a cross-sectional view taken along a line VI—VI shown in FIG. 6B, and FIG. 6D is a front view. The shutter member 7 is composed of a resin molded product integrally formed, and has a main body 77 having terminal insertion holes 75, whose number is the same as the number of the terminals 20 in the second connecting portion 2, each of which can contain one of the terminals 20 formed therein, a pair of arms 71 and 72 respectively formed so as to be projected from both sides of the main body 77, and slide guiding portions 81 and 82 respectively extending in the direction away from the arms 71 and 72 from the sides of the main body 77. The slide guiding portions 81 and 82 are connected to each other by a plate-shaped portion 79. A recess 76 which can receive the main body 25 of the second connecting portion 2 is formed below the plate-shaped portion 79. In the main body 77, spring mounting recesses 781 and 782 for respectively receiving the helical springs 73 and 74 are formed parallel to the terminal insertion holes 75 at positions facing the recess 76.

Rails 83 and 84 are respectively formed in the arms 71 and 72, which are capable of guiding the CF card 110 upon being engaged so as to be slidable with the key grooves 111 on both sides of the CF card 110.

The slide guiding portions 81 and 82 are formed in a laid "U" shape opened toward the second connecting portion 2 as viewed from the side, and can be respectively slidably engaged with the mounting projections 21 and 22 in the second connecting portion 2. For preventing the mounting projections 21 and 22 from being dropped, drop preventing projections 85 are respectively formed at front ends of the slide guiding portions 81 and 82, thereby preventing, after the second connecting portion 2 and the shutter member 7 are assembled with the helical springs 73 and 74 interposed therebetween, an obtained assembly from being disassembled.

Engaging recesses 87 and 88 are respectively formed on side surfaces at both the ends of the main body 77, which are engaged with the engaging portions 95 of the locking springs 91 and 92.

FIGS. 7A to 7C are diagrams showing the construction of an assembly of the second connecting portion 2 and the shutter member 7, where FIG. 7A is a side view, FIG. 7B is a plan view, and FIG. 7C is a cross-sectional view taken along a line VII—VII shown in FIG. 7B. In FIGS. 7A and 7B, the shutter member 7 is indicated by a two-dot and dash line. The assembly is obtained by respectively mounting the helical springs 73 and 74 on the spring mounting recesses 27 and 28 of the connecting portion 2 and the spring mounting recesses 781 and 782 of the shutter member 7, inserting the terminals 20 in the second connecting portion 2 into the terminal insertion holes 75, and engaging the mounting projections 21 and 22 with the slide guiding portions 81 and 82.

The assembly is mounted on the frame 5 by respectively engaging the mounting projections 21 and 22 with the recesses 57 and 58 of the frame 5. Prior to mounting the assembly on the frame 5, the terminals 20 in the second connecting portion 2 are soldered to the printed circuit board 3, and the terminals 10 in the first connecting portion 1 are soldered to the printed circuit board 3. Accordingly, an assembly of the first connecting portion 1, the second connecting portion 2, the printed circuit board 3, and the shutter member 7 is actually mounted on the frame 5.

Thereafter, the metal cover plates 8 and 9 are respectively mounted on the frame 5 from above and below, to complete the card connecting adapter 100. In this state, the shutter member 7 can slide in a direction parallel to the terminals 20 upon being guided by the slide guiding portions 81 and 82 of the second connecting portion 2 and a lower surface of the metal cover plate 8 on the upper surface of the frame 5.

FIGS. 8, 9, 10 and 11 are plan views successively showing state transitions when the CF card 110 is being mounted on the card connecting adapter 110.

Figure 8:
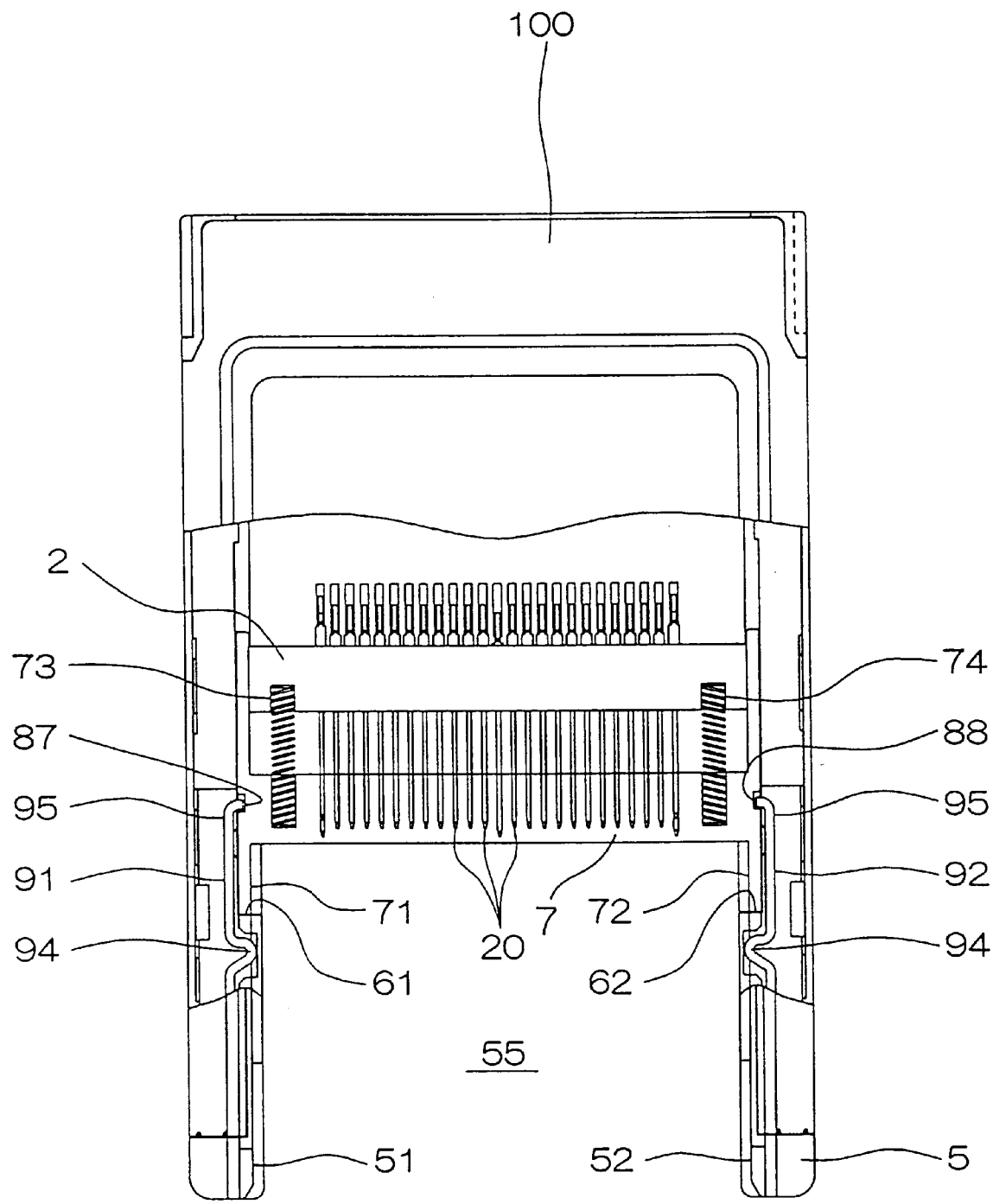
FIG. 8 is a plan view showing a state before a CF card is mounted.

FIG. 8 illustrates a state before the CF card 110 is mounted. In this state, the shutter member 7 is at the protecting position where the terminals 20 in the second connecting portion 2 are embedded in the terminal insertion holes 75 to be protected from deformation due to an external force, and front ends of the pair of arms 71 and 72 are respectively abutted against the steps 61 and 62 of the frame 5. At this time, the engaging portions 95 of the locking springs 91 and 92 are respectively engaged with the engaging recesses 87 and 88 on the side surfaces of the shutter member 7, locking the shutter member 7 at the protecting position. That is, even if a user attempts to press the shutter member 7 with his or her fingers, the shutter member 7 is regulated from sliding by the function of the locking springs 91 and 92. Even if the abutting portion 94 of one of the two locking springs 91 and 92 is pressed by a penpoint, for example, so that the engagement of the engaging portions 95 with the engaging recesses 87 and 88 of the shutter member 7 is released on one side, the sliding of the shutter member 7 is regulated by the engagement of the engaging portions 95 with the shutter member 7 on the other side.

Figure 9:
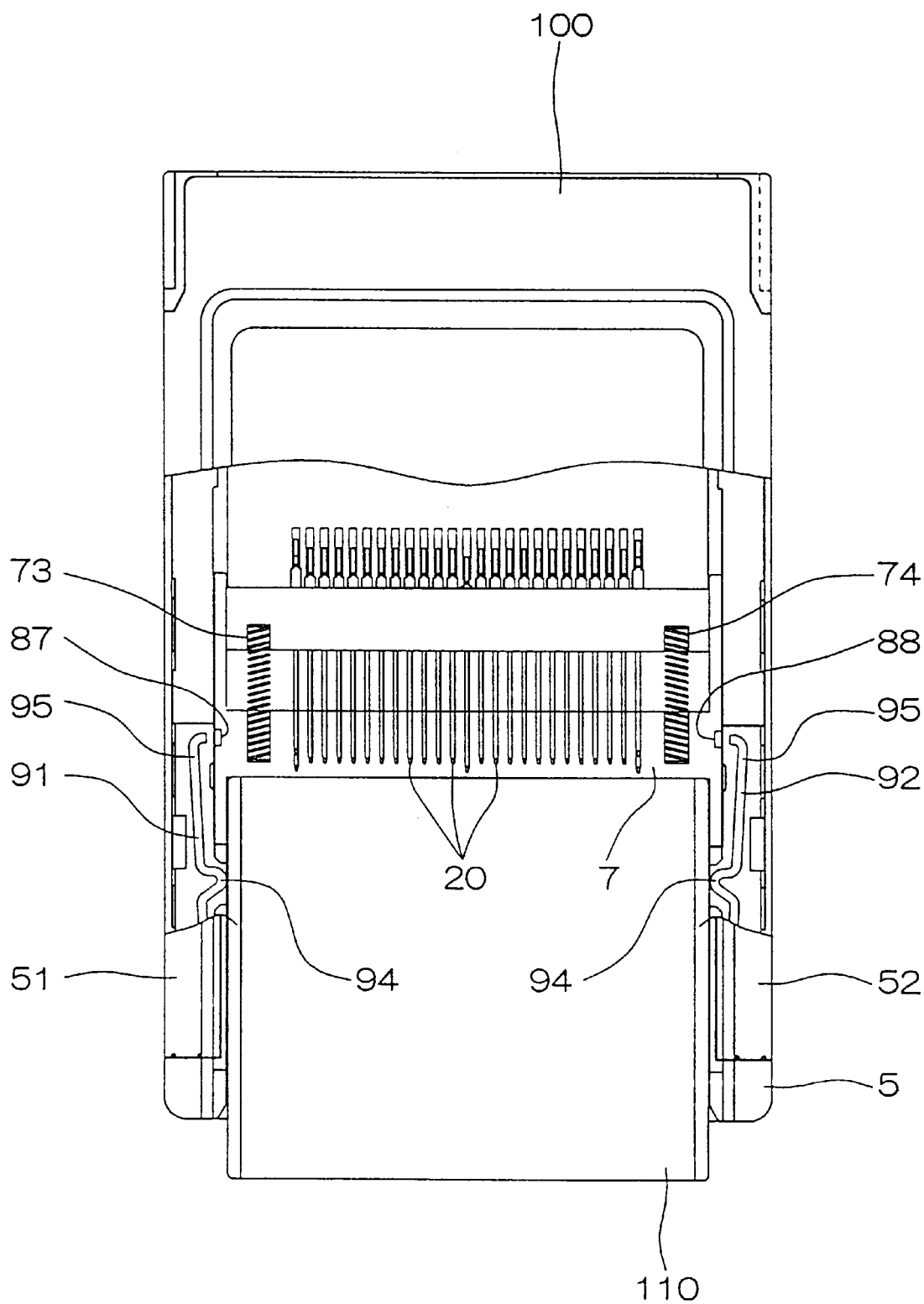
FIG. 9 is a plan view showing an intermediate state where a front end of the CF card is inserted into the position where it is abutted against the shutter member.

FIG. 9 illustrates an intermediate state where the front end of the CF card 110 is inserted into the position where it is abutted against the shutter member 7. In this state, the abutting portions 94 of both the locking springs 91 and 92 are pressed into the frame 5 by the side surfaces of the CF card 110. Correspondingly, the engagement of the engaging portions 95 with the engaging recesses 87 and 88 on the side surfaces of the shutter member 7 is released on both sides of the shutter member 7. Consequently, the shutter member 7 is slidable along the terminals 20.

Figure 10:
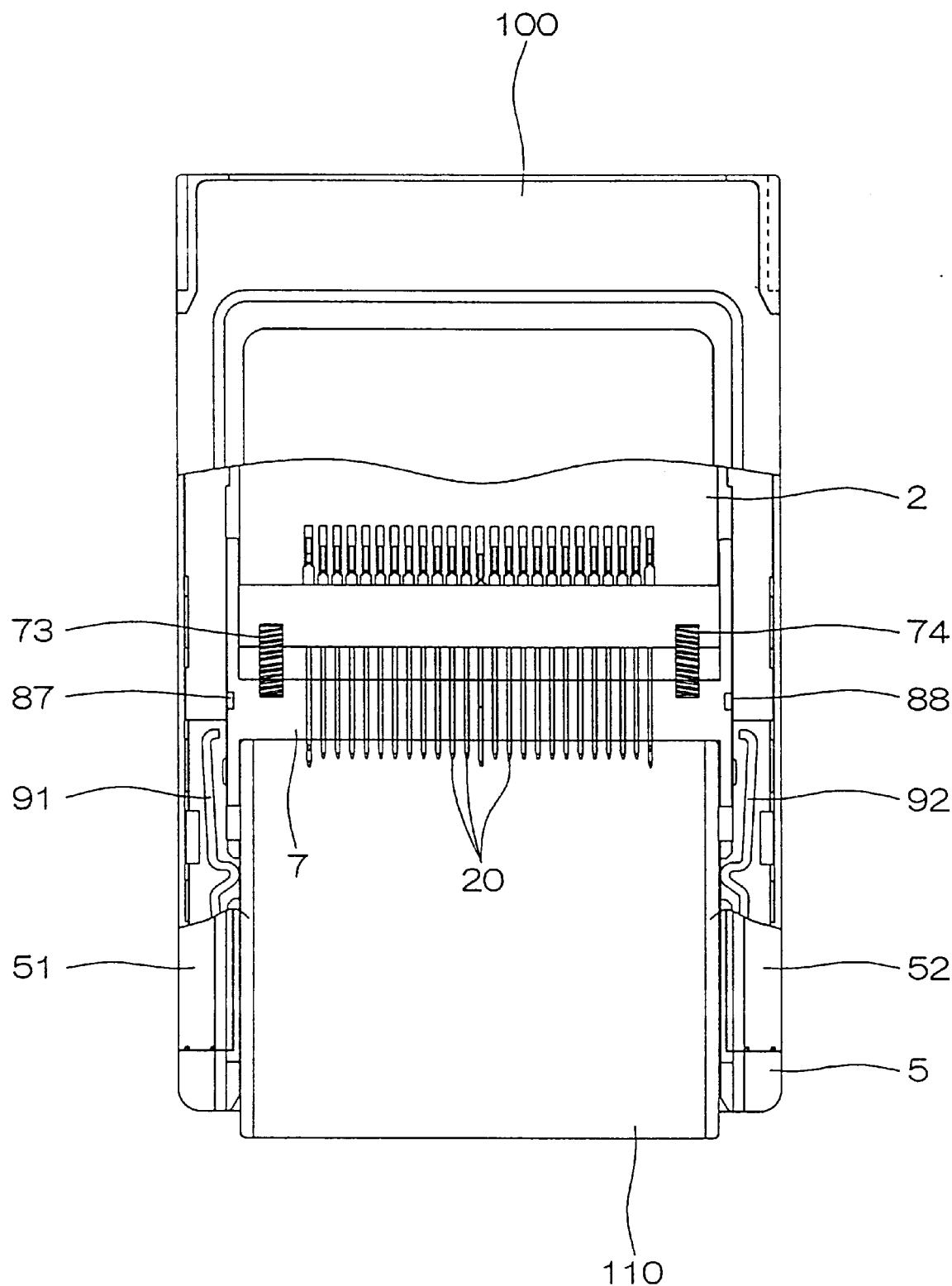
FIG. 10 is a plan view showing an intermediate state where the CF card is further advanced from the state shown in FIG. 9.

FIG. 10 illustrates an intermediate state where the CF card 110 is further advanced from the state shown in FIG. 9. The shutter member 7 which is unlocked retreats upon being pressed by the front end of the CF card 110. At this time, the second connecting portion 2 stands still against the frame 5, so that the terminals 20 are projected from the terminal insertion holes 75 of the shutter member 7. The projected terminals 20 are engaged with the terminals provided in the connecting portion 112 of the CF card 110.

Figure 11:
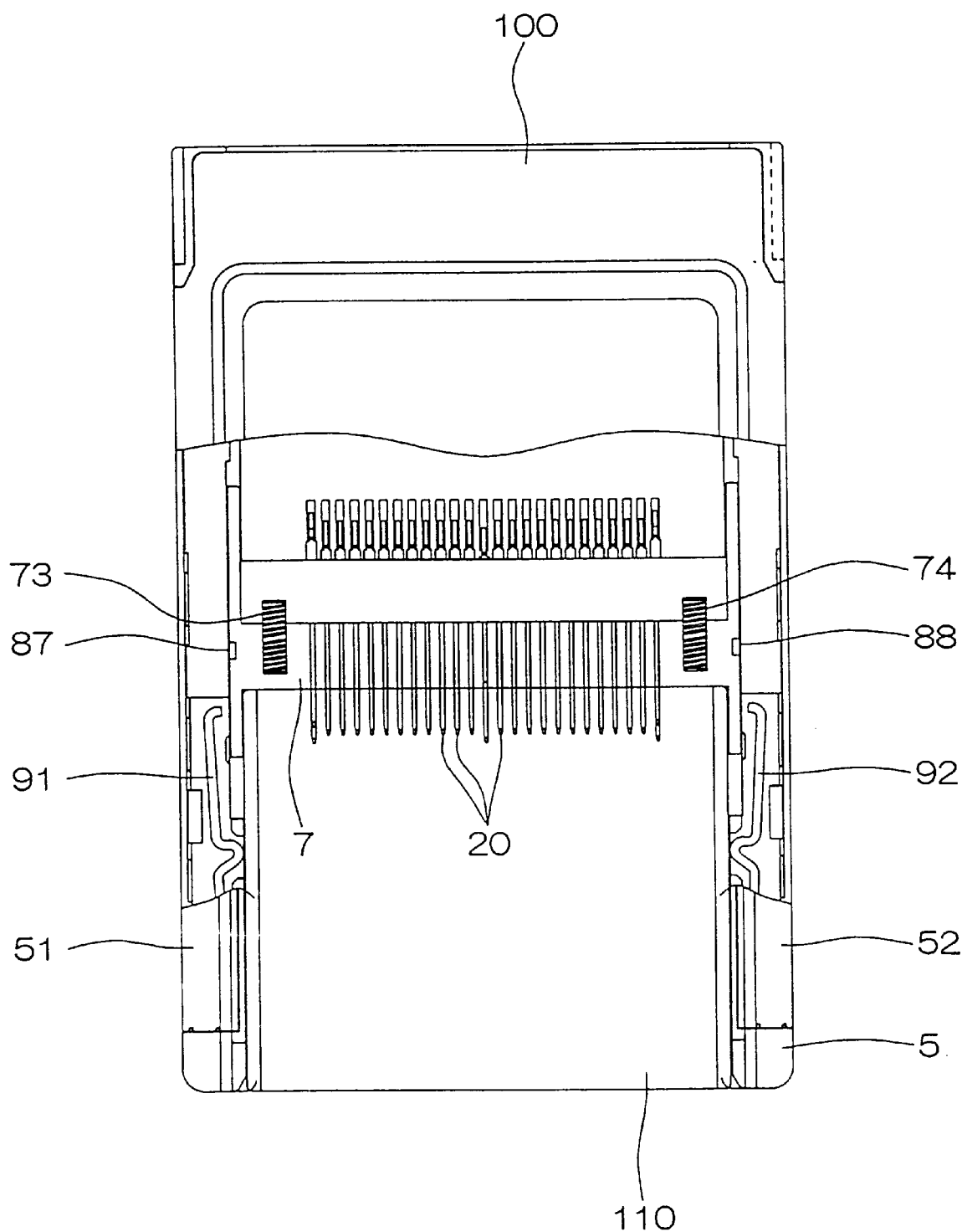
FIG. 11 is a plan view showing a state where the CF card is completely inserted.

FIG. 11 illustrates a state where the CF card 110 is completely inserted. In this state, a rear end surface of the main body 77 of the shutter member 7 is abutted against a front end surface of the second connecting portion 2, to regulate further insertion of the CF card 110. The position of the shutter member 7 at this time is grasped as the connecting position where the connection between the CF card 110 and the second connecting portion 2 is allowed. At this time, the terminals in the connecting portion 112 of the CF card 110 and the terminals 20 in the second connecting portion 2 are completely connected to each other, so that the CF card 110 and the card connecting adapter 100 are integrated, to assume an external form as a PC card adhering to the standard of the type II set by PCMCIA.

Operations of the respective portions in a case where the CF card 110 is removed from the card connecting adapter 100 are reverse to those in a case where the CF card 110 is mounted thereon. That is, the state shown in FIG. 11 proceeds to the state shown in FIG. 8 successively through the states shown in FIGS. 10 and 9. Meanwhile, the shutter member 7 follows the CF card 110 in a state where it is abutted against the front end of the CF card 110 by restoring forces of the helical springs 73 and 74 as the CF card 110 is extracted. Thereafter, the shutter member 7 is regulated from following the CF card 110 by the abutment of the arms 71 and 72 against the steps 61 and 62 of the frame 5. Further, when the CF card 110 retreats, the side surface of the CF card 110 and the abutting portions 94 of the locking springs 91 and 92 are disengaged from each other. The engaging portions 95 and the engaging recesses 87 and 88 on the side surfaces of the shutter member 7 are engaged with each other by restoring forces of the locking springs 91 and 92. Consequently, the shutter member 7 is returned to the protecting position where it covers the terminals 20 as the CF card 110 is extracted, and the locking springs 91 and 92 are returned to their locked positions where they regulate the movement of the shutter member 7.

As described in the foregoing, according to the present embodiment, the shutter member 7 retreats in synchronization with the operation for mounting the CF card 110, to expose the terminals 20 in the second connecting portion 2 to the exterior of the shutter member 7. Even if the distance between the respective surfaces of the metal covers 8 and 9 (that is, the thickness of the card connecting adapter 100) and the thickness of the CF card 110 are equal to each other, the connection therebetween can be achieved. In a state where the CF card 110 has not been mounted yet, the shutter member 7 is at the protecting position where it covers the terminals 20, so that the terminals 20 can be protected from the deformation due to the external force. Moreover, the locking springs 91 and 92 are provided for holding the shutter member 7 at the protecting position in the state where the CF card has not been mounted yet, so that the shutter member 7 may not carelessly slide so long as the CF card 110 is not mounted. The protection of the terminals 20 from the external force is thus made more perfect.

Furthermore, in removing the mounted CF card 110, the shutter member 7 is restored to the protecting position by the restoring forces of the helical springs 73 and 74, and the locking springs 91 and 92 are restored to the locked positions. After the CF card 110 is removed, therefore, the shutter member 7 can be returned to a state where it can reliably protect the terminals 20 from the external force.

The shutter member 7 is always pressed against the front end surface of the CF card 110, while it is sliding, by the function of the helical springs 73 and 74. Even in the course of mounting or removing of the CF card 110, therefore, the terminals 20 are not exposed to the exterior. This also makes it possible to effectively prevent the terminals 20 from being deformed due to the external force.

Figure 12A:
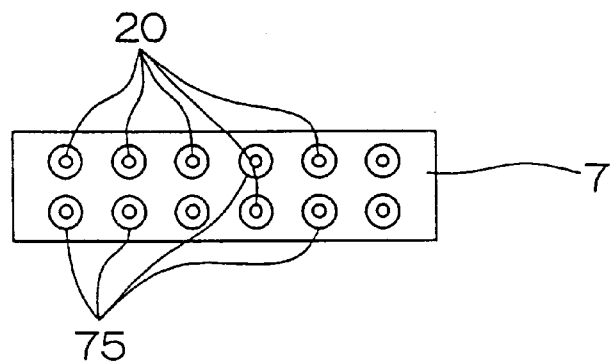
FIGS. 12A to 12E are front views showing various modified examples of the shutter member.

FIGS. 12A to 12E are front views showing various modified examples of the shutter member 7, which illustrate a state where the shutter member 7 is viewed from the mounting space 55. FIG. 12A illustrates the shutter member 7 in the above-mentioned embodiment, where a circular terminal insertion hole 75 is formed as viewed from the front for each of terminals 20, and the terminals 20 are respectively inserted into the terminal insertion holes 75.

Figure 12B:
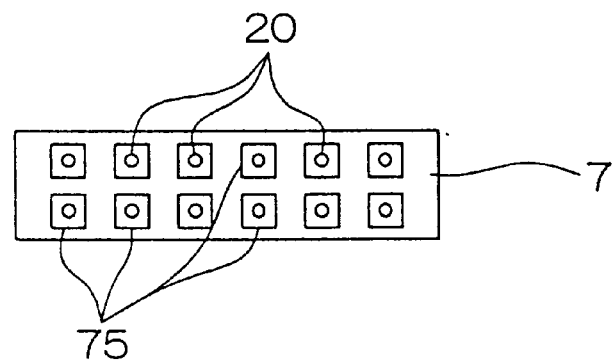

FIG. 12B illustrates an example in which a terminal insertion hole 75 is a square hole which is approximately square as viewed from the front.

Figure 12C:
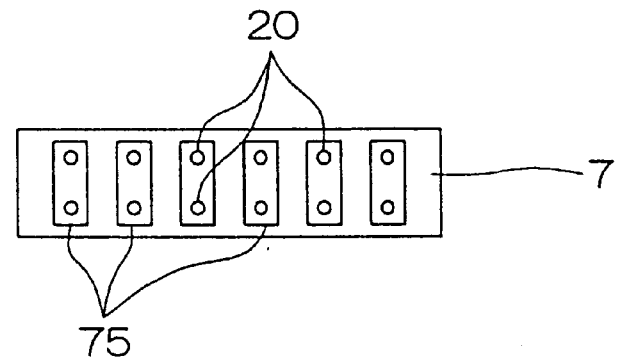
Figure 12D:
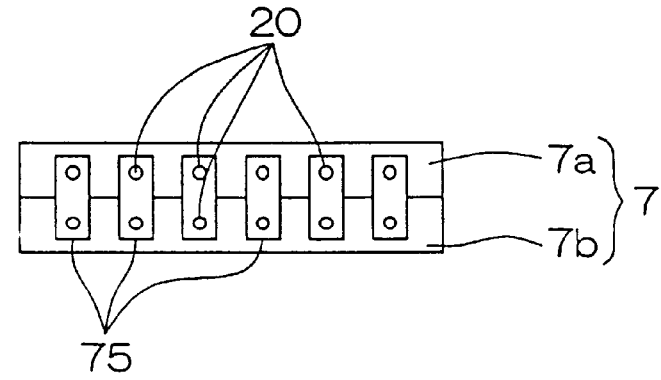

FIG. 12C illustrates an example in which a terminal insertion hole 75 having a rectangle shape which longitudinally extends as viewed from the front is formed for each pair of upper and lower terminals 20. In this case, a shutter member 7 may be constructed by overlapping a pair of upper and lower molded products 7a and 7b as shown in FIG. 12D for convenience of the fabricating processes, for example.

Figure 12E:
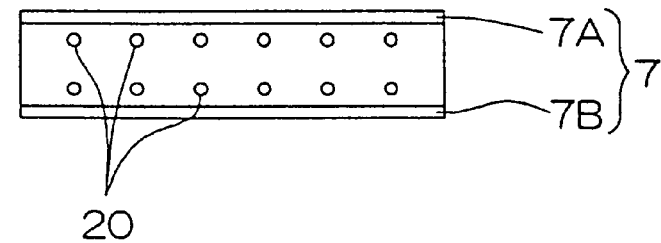
Figure 14:
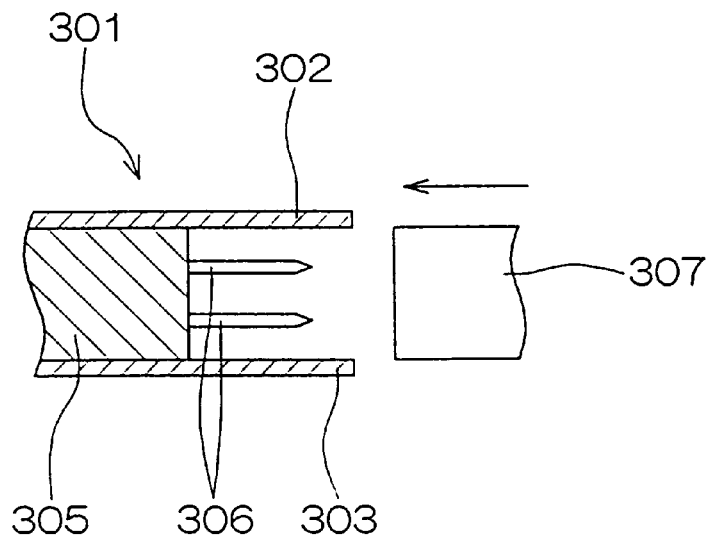
FIG. 14 is an illustration showing the construction of a connecting portion between a conventional card connecting adapter and a CF card.
Figure 15:
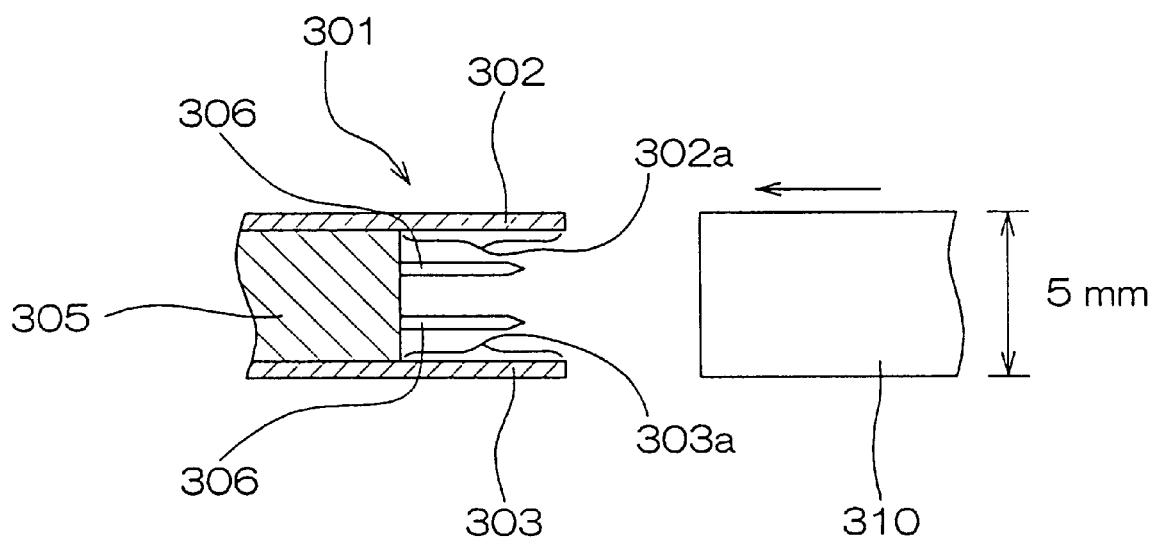
FIG. 15 is an illustration for explaining problems in a case where the conventional card connecting adapter and a CF card of the type II are connected to each other.

FIG. 12E illustrates an example in which a pair of flat places 7A and 7B opposite to each other constitute a shutter member 7, and terminals 20 are contained in a containing space between the flat plates 7A and 7B. Since the sides of the terminals 20 are protected by a frame 5, only protection of the terminals 20 from an external force in the vertical direction is sufficient. Even by this construction, therefore, the protection of the terminals 20 from the external force is achieved. Because the terminals 20 are protected from deformation due to the external force, the contact among the terminals 20 need not be so considered. Even if the terminals 20 are not protected separately from one another, therefore, a necessary function of the shutter member 7 can be achieved by the construction shown in FIG. 12E.

It is preferable that the shutter member 7 is composed of a resin molded product even when it has any one of the structures shown in FIGS. 12A to 12E. In the case of the structure shown in FIG. 12E, however, it is hardly possible that the shutter member 7 is brought into contact with the terminals 20, so that the flat plates 7A and 7B may be composed of metal plates.

Although the embodiments of the present invention have been described, the present invention can be also carried out by another embodiment. For example, it is possible to modify the locking mechanisms for locking the shutter member 7 at the protecting position, the interlocking mechanisms for sliding the shutter member 7 in synchronization with the mounting of the CF card 110, or any other structure. For example, a locking mechanism may be formed by providing locking members at both ends of the shutter member 7, further providing a link mechanism or a cam mechanism for driving the locking members in synchronization with the mounting/removal of the CF card 110, and forming locking engaging recesses which can be respectively engaged with the locking members in corresponding portions of the frame 5. In this case, it is preferable that the link mechanism or the cam mechanism is urged toward its locked position by the helical springs 73 and 74.

Although in the above-mentioned embodiments, the front end surface of the CF card 110 and the shutter member 7 are abutted against to each other, to prevent the terminals 20 in the second connecting portion 2 from being exposed, the terminals 20 may be temporarily exposed for a short time immediately before the connecting portion 112 of the CF card 110 and the second connecting portion 2 are connected to each other and immediately after they are disconnected from each other. When the CF card 110 is mounted, therefore, the shutter member 7 may start to slide from the protecting position to the connecting position earlier than the time when the front end surface of the CF card 110 and the shutter member 7 are abutted against each other. When the CF card 110 is removed, the shutter member 7 may slide from the connecting position to the protecting position slightly later than the time when the CF card 10 is extracted.

A spring for urging the shutter member 7 toward the protecting position is not limited to a helical compression spring. For example, a tension spring, a leaf spring, and so forth may be utilized.

While the invention has been described in detail, the foregoing description is in all aspects illustrative and not restrictive. It should be understood that numerous other modifications and variations can be devised without departing from the scope of the invention.

This application claims priority benefits under 35 USC § 119 of Japanese Patent Application Serial No. 10-45960 filed on Feb. 26, 1998, the entire disclosure of which is incorporated herein by reference.

What is claimed is:

1. A card connecting adapter used for connecting, to a card slot adhering to a predetermined first standard, a card adhering to a second standard different from the first standard, the card connecting adapter comprising:
a first connecting portion adhering to the first standard;
a second connecting portion adhering to the second standard;
a plurality of terminals provided in the second connecting portion for electrical connection to a card adhering to the second standard;
shutter mechanisms having a shutter member provided so as to be displaceable between a protecting position where the plurality of terminals are protected from exterior and a connecting position where the plurality of terminals are exposed, and interlocking mechanism for displacing the shutter member from the protecting position to the connecting position in synchronization with an operation for mounting the card on the second connecting portion, while displacing the shutter member from the connecting position to the protecting position in synchronization with an operation for removing the card from the second connecting portion; and
locking mechanism which enters an unlocked state where the displacement of the shutter member is allowed in synchronization with the operation for mounting the card on the second connecting portion, while entering a locked state where the displacement of the shutter member is inhibited in synchronization with the operation for removing the card from the second connecting portion,
wherein the locking mechanism includes a locking spring member which is disengaged from the shutter member upon being elastically deformed by the mounting of the card, while being returned to an engaged state with the shutter member by the removal of the card, said locking spring member being formed of one piece.

2. The card connecting adapter according to claim 1, wherein
the locking spring member enters the unlocked state earlier than when the sliding of the shutter member is started by the interlocking mechanisms.

3. The card connecting adapter according to claim 1, wherein
the interlocking mechanism includes a guiding member for guiding the card in the direction in which the shutter member is mounted/removed.

4. The card connecting adapter according to claim 1, wherein
the interlocking mechanism includes a spring member for elastically urging the shutter member toward the protecting position.

5. The card connecting adapter according to claim 1, wherein
the interlocking mechanism displaces the shutter member with an end surface of the card and an end of the shutter member being kept abutted against each other.

6. The card connecting adapter according to claim 1, wherein the locking spring member is deformed by a predetermined part of the mounted card.

7. The card connecting adapter according to claim 1, wherein the locking spring member has an abutting portion which is abutted against the card that is being mounted and an engaging portion which is engaged with a predetermined part of the shutter member, and is elastically deformed upon abutment of the card that is being mounted against the abutting portion, the engaging portion and the shutter member being disengaged from each other by the elastic deformation.

8. The card connecting adapter according to claim 1, wherein the locking spring members are provided in relation to both sides with respect to the direction of mounting of the card.

9. The card connecting adapter according to claim 1, wherein
the shutter member has terminal insertion holes each of which can contain a predetermined number of terminals out of the plurality of terminals in the second connecting portion, so that the plurality of terminals can be contained in the plurality of terminal insertion holes at the protecting position, while being exposed from the plurality of terminal insertion holes at the connecting position.

10. The card connecting adapter according to claim 9, wherein
each one of the terminal insertion holes corresponds to one of the terminals in the second connecting portion.

11. The card connecting adapter according to claim 1, wherein
the shutter member has a pair of flat plates arranged opposite to each other with the plurality of terminals in the second connecting portion interposed therebetween, so that the plurality of terminals can be contained in a containing space between the pair of flat plates at the protecting position, while being exposed.

12. The card connecting adapter according to claim 1, further comprising:
a main body of said second connecting portion, wherein said shutter member slidably engages said main body.

13. The card connecting adapter according to claim 12, further comprising:
one or more projections extending from first and second ends of said main body, wherein said shutter member slidably engages said one or more projections.

14. The card connecting adapter according to claim 12, wherein said shutter member includes a plurality of arms extending in a direction away from said first connecting portion.

15. The card connecting adapter according to claim 1, wherein said shutter member includes a plurality of arms extending in a direction away from said first connecting portion.

16. A card connecting adapter used for connecting, to a card slot adhering to a predetermined first standard, a card adhering to a second standard different from the first standard,
the card connecting adapter comprising:
a first connecting portion adhering to the first standard;
a second connecting portion adhering to the second standard;
a plurality of terminals provided in the second connecting portion for electrical connection to a card adhering to the second standard;
a main body of said second connecting portion;
shutter mechanisms having a shutter member slidably engaging said main body and being displaceable between a protecting position where the plurality of terminals are protected from exterior and a connecting position where the plurality of terminals are exposed, and interlocking mechanism for displacing the shutter member from the protecting position to the connecting position in synchronization with an operation for mounting the card on the second connecting portion, while displacing the shutter member from the connecting position to the protecting position in synchronization with an operation for removing the card from the second connecting portion; and
a locking mechanism which enters an unlocked state where the displacement of the shutter member is allowed in synchronization with the operation for mounting the card on the second connecting portion, while entering a locked state where the displacement of the shutter member is inhibited in synchronization with the operation for removing the card from the second connecting portion;
wherein the locking mechanism includes a locking spring member being formed of one piece.

17. The card connecting adapter according to claim 16, wherein said main body comprises one or more projections extending from first and second ends of said main body, wherein said shutter member slidably engages said one or more projections.

18. The card connecting adapter according to claim 16, wherein said shutter member includes a plurality of arms extending in a direction away from said first connecting portion.

19. A card connecting adapter used for connecting, to a card slot adhering to a predetermined first standard, a card adhering to a second standard different from the first standard,
the card connecting adapter comprising:
a first connecting portion adhering to the first standard;
a second connecting portion adhering to the second standard;
a plurality of terminals provided in the second connecting portion for electrical connection to a card adhering to the second standard;
shutter mechanisms having a shutter member provided so as to be displaceable between a protecting position where the plurality of terminals are protected from exterior and a connecting position where the plurality of terminals are exposed, and interlocking mechanism for displacing the shutter member from the protecting position to the connecting position in synchronization with an operation for mounting the card on the second connecting portion, while displacing the shutter member from the connecting position to the protecting position in synchronization with an operation for removing the card from the second connecting portion, said shutter member including a plurality of arms extending in a direction away from said first connecting portion; and
a locking mechanism which enters an unlocked state where the displacement of the shutter member is allowed in synchronization with the operation for mounting the card on the second connecting portion, while entering a locked state where the displacement of the shutter member is inhibited in synchronization with the operation for removing the card from the second connecting portion;
wherein the locking mechanism includes a locking spring member being formed of one piece.

* * * * *